United States Patent [19]
Lee

[11] Patent Number: 5,725,969
[45] Date of Patent: Mar. 10, 1998

[54] METHOD OF MANUFACTURING PHASE-SHIFTING MASK COMPRISING A LIGHT SHIELD PATTERN ON A PHASE-SHIFTING ATTENUATTING LAYER

[75] Inventor: Jun Seok Lee, Seoul, Rep. of Korea

[73] Assignee: LG Semicon Co., Ltd., Chungcheongbuk-do, Rep. of Korea

[21] Appl. No.: 576,897

[22] Filed: Dec. 22, 1995

[30] Foreign Application Priority Data

Sep. 25, 1995 [KR] Rep. of Korea ............... 31652/1995

[51] Int. Cl.⁶ ....................................................... G03F 9/00
[52] U.S. Cl. .............................. 430/5; 430/311; 430/313; 430/394
[58] Field of Search .................... 430/5, 311, 313, 430/394

[56] References Cited

U.S. PATENT DOCUMENTS

| | | | |
|---|---|---|---|
| 5,286,581 | 2/1994 | Lee | 430/5 |
| 5,358,807 | 10/1994 | Okamoto | 430/5 |
| 5,429,897 | 7/1995 | Yoshioka et al. | 430/5 |
| 5,565,286 | 10/1996 | Lin | 430/5 |

OTHER PUBLICATIONS

E. Tamechika et al., "Resolution Improvement Using Auxiliary Pattern Groups in Oblique Illumination Lithography," Dec. 1993, pp. 5856–5862, Jpn. J. Appl. Phys., vol. 32, Pt. 1 No. 12B.

M.D. Levenson, et al., "Improving Resolution in Photolithography with a Phase–Shifting Mask," Dec. 1982, pp. 1828–1836, IEEE Transactions on Electron Devices, vol. ED, 29, No. 12.

B.J. Lin, "The Attenuated Phase–Shifting Mask," Jan 1992, pp. 43–47, Solid State Technology.

*Primary Examiner*—S. Rosasco

[57] ABSTRACT

A phase-shifting mask which has a supplementary pattern arranged for preventing unwanted constructive interference of light caused when isolated patterns (transparent regions) are arranged adjacently. Also, a method for manufacturing such a phase-shifting mask, including the steps of providing a transparent substrate, a phase-shifting layer having transparent regions formed on the transparent substrate, and a supplementary light shielding patterns formed on the phase-shifting layer between the transparent regions.

32 Claims, 16 Drawing Sheets

$(IV \rightarrow IV')$ (VIII — VIII')

F I G.8c
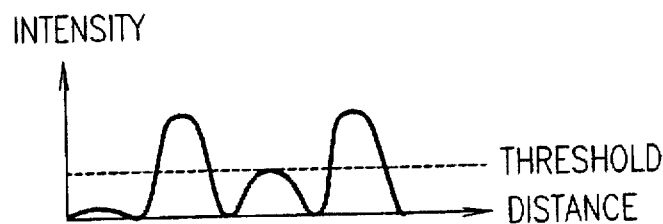
F I G.9a
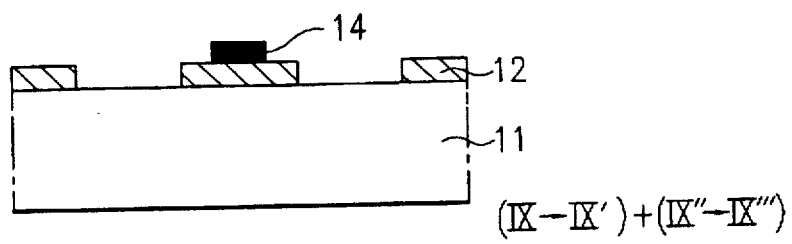
F I G.9b
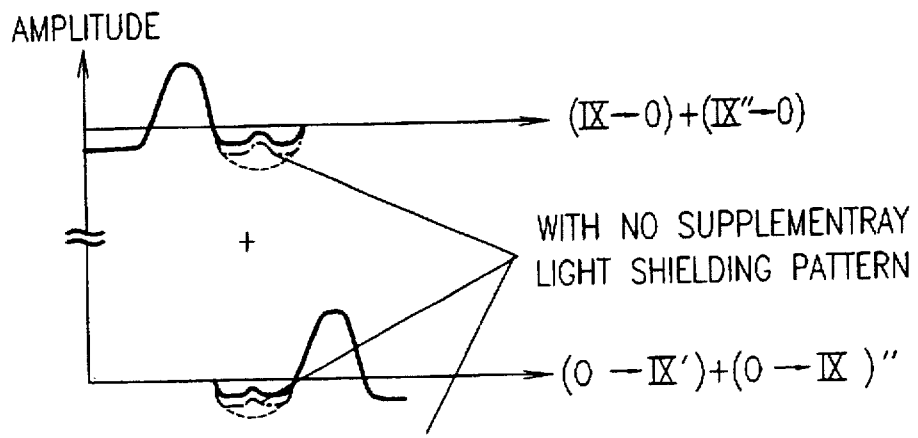
F I G.9c
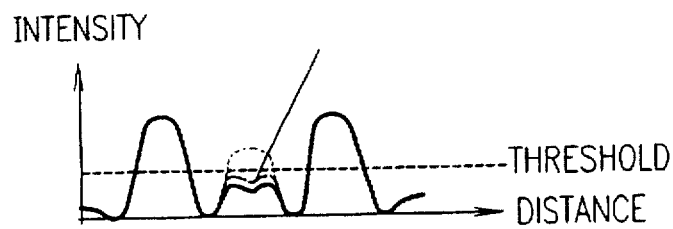

F I G.10
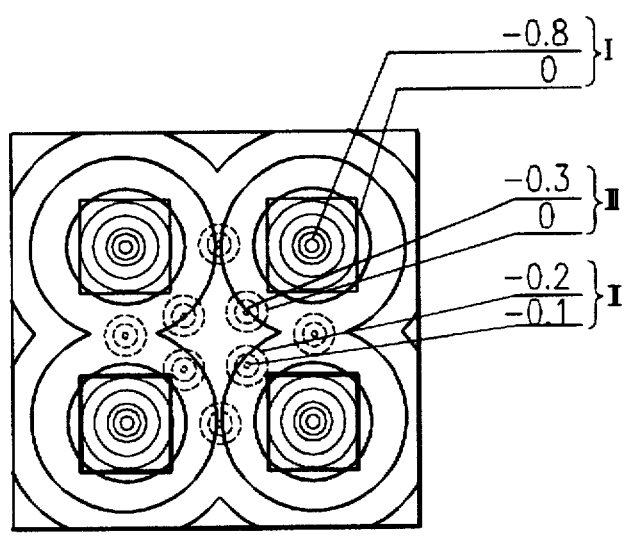

(XII → XII")

WITH NO SUPPLYMENTARY
LIGHT SHIELDING PATTERN

F I G.12c
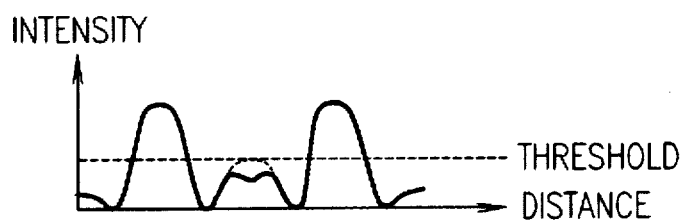
F I G.13a
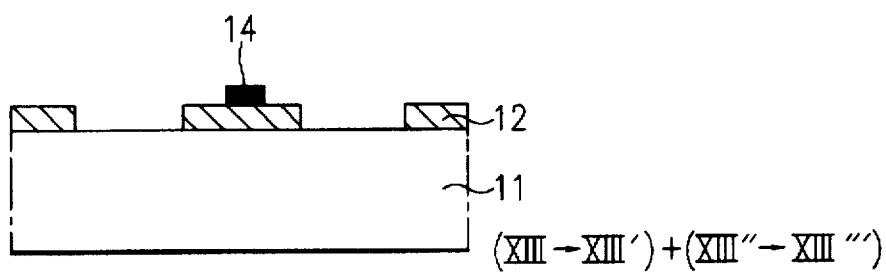
F I G.13b
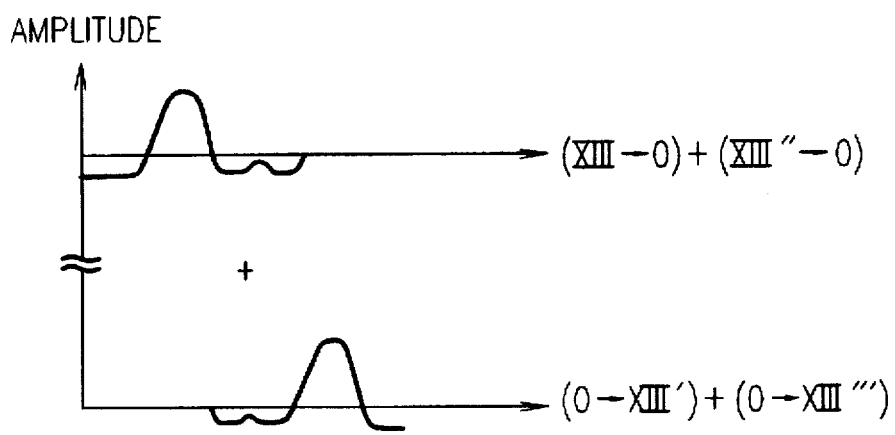
F I G.13c

F I G.14
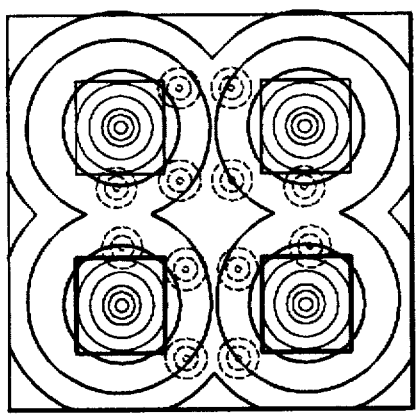

F I G.15
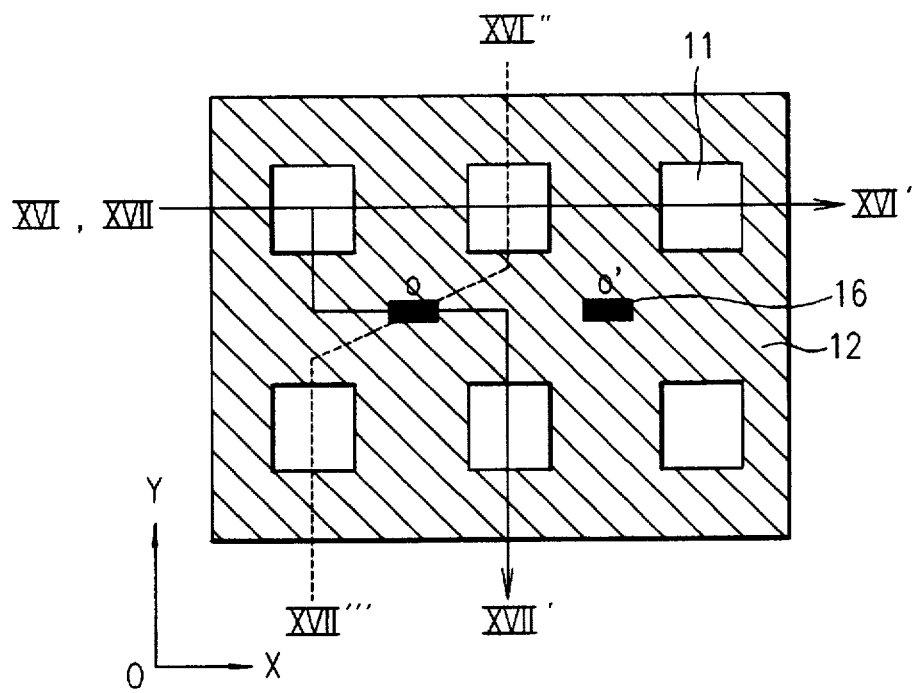
F I G.16a
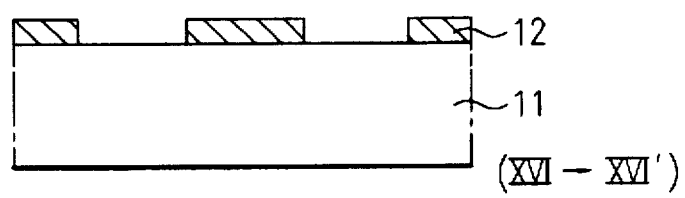
F I G.16b
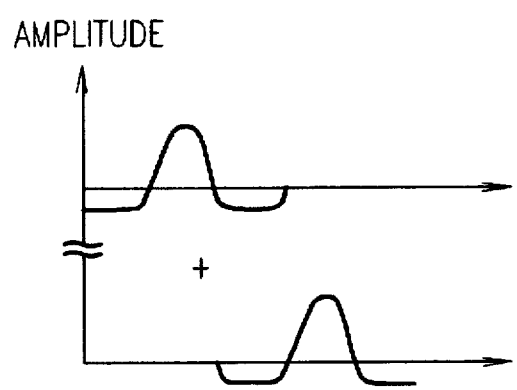

FIG.16c
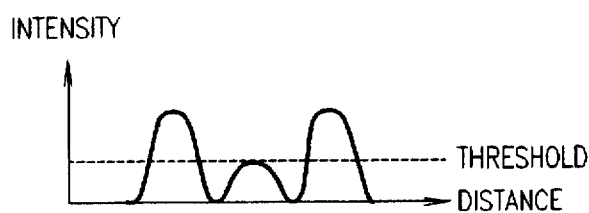
FIG.17a
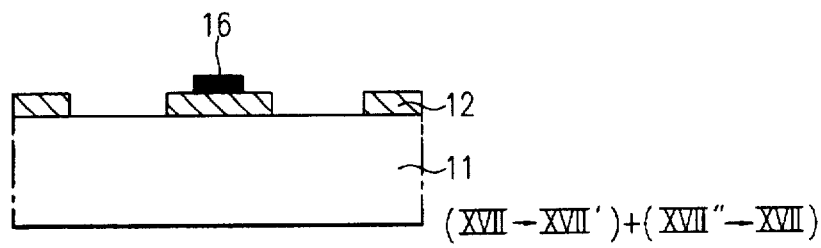
FIG.17b
FIG.17c
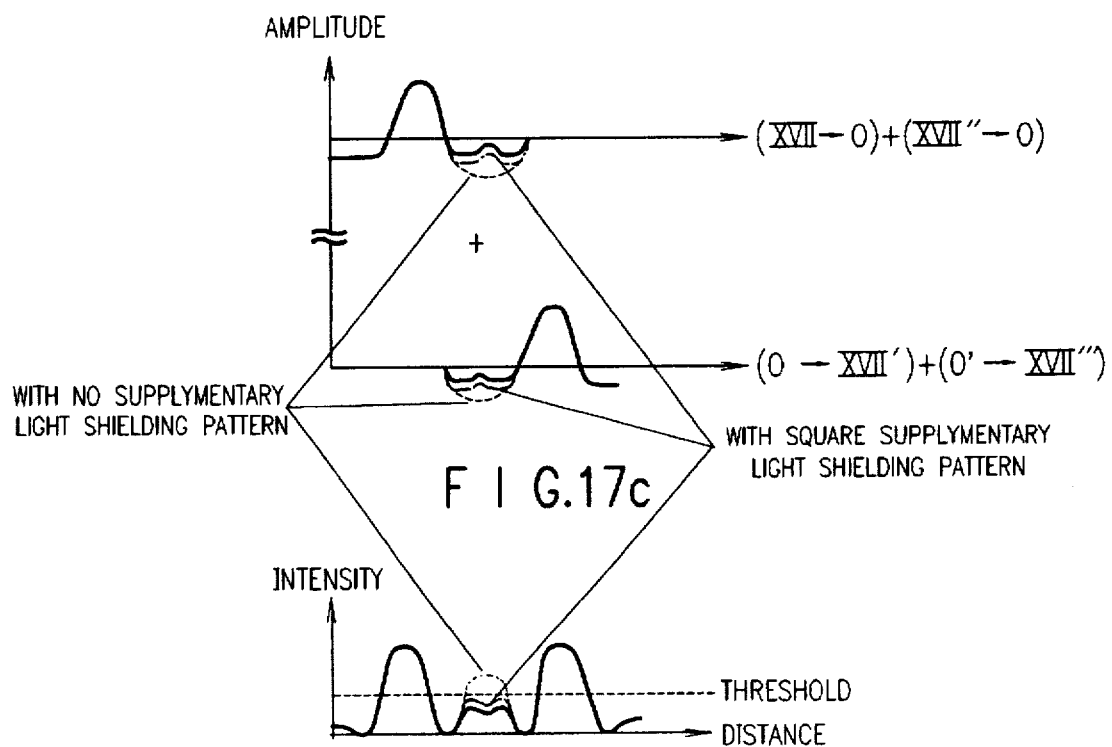

F I G.21
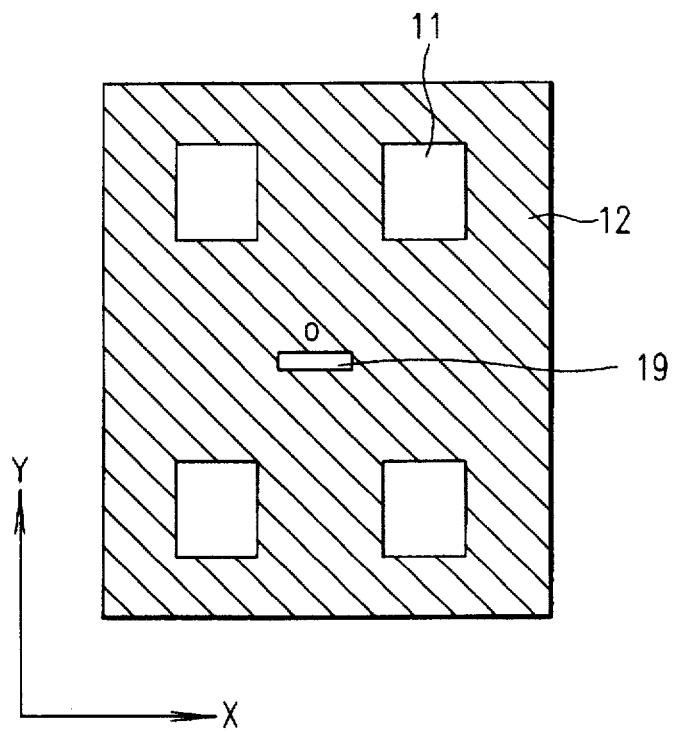
F I G.22
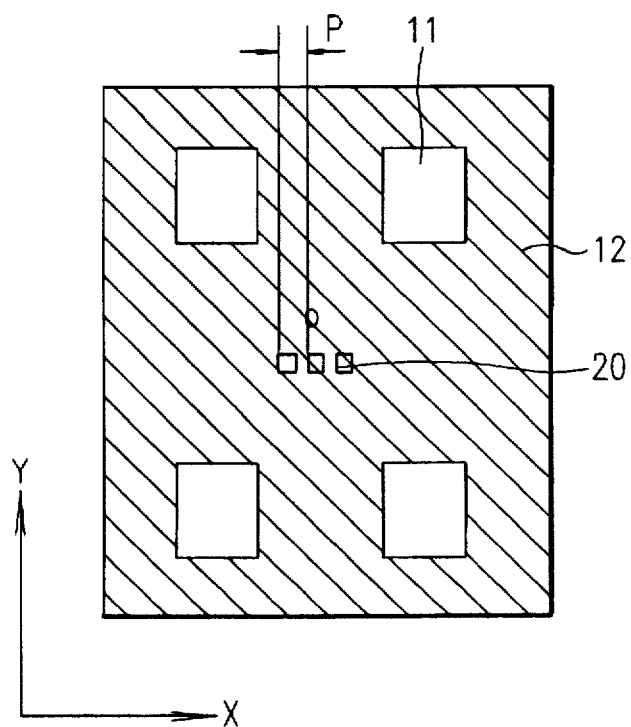

METHOD OF MANUFACTURING PHASE-SHIFTING MASK COMPRISING A LIGHT SHIELD PATTERN ON A PHASE-SHIFTING ATTENUATTING LAYER

BACKGROUND OF THE INVENTION

The present invention relates to a phase shifting mask, more particularly, to a phase-shifting mask which has a supplementary pattern arranged for prevention of constructive interference of amplitudes caused when isolated patterns are arranged adjacently; and a method for manufacturing thereof.

In general, the photolithography process used in manufacturing semiconductors uses a mask which consists of a part that permits transmission of light in a shape to which a semiconductor is to be shaped and the other part that blocks transmission of light.

As the techniques of mask manufacturing develop, variations in masks to which a phase difference of light has been applied have appeared, by which limits of optical resolution has been improved.

FIGS. 1a to 1d show a conventional mask and the amplitude distributions thereof. Specifically, FIG. 1a shows a plane view of the conventional mask. FIG. 1b shows amplitude vs. distance at the mask, FIG. 1c shows amplitude vs. distance at a wafer, and FIG. 1d shows light intensity vs. distance at the wafer.

That is, as shown in FIG. 1a, the conventional mask is formed on a transparent substrate dividing the substrate into a transparent region 11 through which light can be transmitted and a light shielding region 13 through which light can not be transmitted.

However, the conventional mask has light interference at the boundary of the transparent region 11 and the light shielding region 13, which prevents light energy from effectively reaching a surface of photoresist. This causes a profile that is not sharp in its entirety, which limits of resolution.

That is, though a shape the amplitude at the mask is square as shown in FIG. 1b, the shapes of the light energy and intensity become gentle (i.e., rounded) as shown in FIGS. 1c and 1d due to light interference at the boundary of the transparent region 11 and the light shielding region 13.

In order to overcome the problem of the conventional mask, various phase-shifting masks have been developed: the alternate type phase-shifting mask, the RIM type phase-shifting mask e.g., "Improving Resolution in Photolithography with a Phase-Shifting Mask," Levenson et al., *ITEE Transactions on Electron Devices*, vol. ED 29, No. 12, Dec. 1982, pages 1828–1836; having a light shielding pattern; a phase-shifting layer proposed for improving a resolution limit of contact holes by Nitayama et al.; and, recently, the half-tone phase-shifting mask(attenuated phase-shifting mask) for reducing an area of a phase-shifting mask.

The conventional phase-shifting mask will be explained with reference to the attached drawings.

FIGS. 2a to 2d show a conventional phase-shifting mask having a singly isolated pattern and the amplitudes thereof.

More specifically, FIG. 2a shows a plane view of the conventional phase-shifting mask having a singly isolated pattern, FIG. 2b is a graph showing amplitude at the mask with respect to distance, FIG. 2c is a graph showing amplitude at a wafer with respect to distance, and FIG. 2d is a graph showing light intensity at a wafer with respect to distance.

That is, as shown in FIG. 2a, the conventional phase-shifting mask having a singly isolated pattern includes a transparent region 11 which permits transmission of light and a phase shifting layer 12 formed in a light shielding region, which permits transmission of light below 30% and shifts the phase of lights, both of them formed on a transparent substrate.

Therefore, as shown in FIG. 2b, the great difference of amplitudes obtainable between the transparent region and the light shielding region prevents the offset and strengthening of light energy at the boundary of the transparent region and the light shielding region, permitting accurate photolithography.

However, in a phase-shifting mask having a plurality of isolated patterns(transparent regions) arranged adjacently, offset and strengthening of light energy among the adjacent patterns can occur.

FIG. 3 shows a plane view of a conventional phase-shifting mask having a plurality of isolated patterns (transparent regions) arranged adjacently. FIGS. 4a–4c are a sectional view of the mask across the line IV–IV' in FIG. 3 and the amplitudes thereof, FIGS. 5a–5c are a sectional view of the mask across the lines V–V' and V"–V'" in FIG. 3 and the amplitudes thereof, and FIG. 6 shows distribution of light intensity of the conventional phase-shifting mask having a plurality of isolated patterns in FIG. 3.

In the case that four isolated patterns (transparent regions) are adjacently spaced by an equal distance, a distribution of light energy among the isolated patterns will be explained.

Herein, reference number 11 is a transparent region, and reference number 12 is a phase-shifting layer that is semi-transparent and shifts a phase.

First, behavior of light energy between the two isolated patterns shown in FIG. 4a will be explained.

Constructive interference of light of negative amplitude components occurs at a point C, which is half way from each of the centers of the isolated patterns (transparent regions). This causes resolution in the transparent region to improve, but a size of the reduced unwanted intensity peak remains directly proportional to the energy of a light source is the greater.

That is, since each of the isolated patterns has an amplitude as shown in FIG. 4b, negative amplitude constructive interference occurs at the point C, which is a half-way from each of the centers of the isolated patterns. Therefore, the unwanted light intensity peak becomes greater in proportion to the energy of the light source, which affects etching of an underlying substrate of a photoresist when the intensity peak of the light energy is greater than a threshold value.

Moreover, at a point where distances to each of the four isolated patterns are equal, the negative amplitude light constructive interference becomes the greatest with the greatest light energy thereon.

FIG. 5a is a sectional view of the phase-shifting mask in FIG. 3 showing the center point o of the four isolated patterns. FIG. 5b shows overlaps of the amplitudes both for the sections across VO and V"O, and the sections across VV' and V"V'", and FIG. 5c shows an overlap of all above amplitudes in FIG. 5b.

At the center O where the amplitude across sections VO and V"O and the amplitude across sections VV' and V"V'" are overlapped, the light intensity is much strengthened so as to produce an unwanted light intensity peak.

The light energy distribution at a wafer surface according to aforementioned principle is as shown in FIG. 6.

When the light intensity distribution(I) at the transparent region 11 is assumed to be 0.8~0, the light intensity distribution(II) of negative amplitude formed by the four light shielding regions is −0.6—−0.1, and the light intensity distribution(III) of negative amplitude formed by and between any of the two adjacent light shielding regions is −0.6—−0.1.

Therefore, the conventional phase-shifting mask wherein isolating patterns exist repeatedly as explained has following problems.

That is, when an attenuated phase-shifting mask is exposed, even though a light intensity slope by one transparent region is formed steeply, the aggregate light intensity of many transparent regions may cause formation of unwanted light intensity peaks, which are directly proportional to the light intensity of a light source becomes stronger.

SUMMARY OF THE INVENTION

To solve the problems of the conventional arts, it is an object of the present invention to provide a method of manufacturing a phase-shifting mask which can lessen the overlapped light intensity(side lobe) of negative components by additional arrangement of at least one supplementary light shielding pattern in an attenuated mask for improving resolution of the mask.

In one aspect of the present invention, there is provided a method of manufacturing a phase-shifting mask including the steps of: providing a transparent substrate; forming a phase-shifting layer on the transparent substrate; selectively removing the phase-shifting layer to form a half-tone mask having a plurality of transparent regions; and forming at least one light shielding pattern on the phase-shifting layer between the transparent regions.

In other aspect of the present invention, there is provided a phase-shifting mask including a transparent substrate, a phase-shifting layer having a plurality of transparent regions formed on the transparent substrate, and a plurality of supplementary light shielding patterns formed on the phase-shifting layer between the transparent regions.

BRIEF DESCRIPTION OF THE DRAWINGS

The object, advantages and features of the present invention will become more apparent from the following description and drawing in which:

FIGS. 8a–8c show a sectional view of the phase-shifting mask across line VIII–VIII' in FIG. 7 and the amplitudes;

FIGS. 9a–9c show a sectional view of the phase-shifting mask across lines IX–IX' and IX"–IX'" in FIG. 7 and the amplitudes;

FIG. 10 shows a light energy distribution of the phase-shifting mask in accordance with the first embodiment of the present invention;

FIGS. 12a–12c show a sectional view of the phase-shifting mask across line XII–XII' in FIG. 11 and the amplitudes;

FIGS. 13a–13c show a sectional view of the phase-shifting mask across lines XIII–XIII' and XIII"–XIII'" in FIG. 11 and the amplitudes;

FIG. 14 shows a light intensity distribution of the phase-shifting mask in accordance with the second embodiment of the present invention;

FIG. 15 shows a plane view of a phase-shifting mask in accordance with a third embodiment of the present invention;

FIGS. 16a–16c show a sectional view of the phase-shifting mask across line XVI–XVI' in FIG. 15 and the amplitudes;

FIGS. 17a–17c show a sectional view of the phase-shifting mask across lines XVII–XVII' and XVII"–XVII'" in FIG. 15 and the amplitudes;

FIG. 21 shows a plane view of a phase-shifting mask in accordance with a sixth embodiment of the present invention;

FIG. 22 shows a plane view of a phase-shifting mask in accordance with a seventh embodiment of the present invention.

DETAILED DESCRIPTION OF THE PREFERRED EMBODIMENTS

The present invention will be explained in detail with reference to the attached drawings.

Figure 1A:
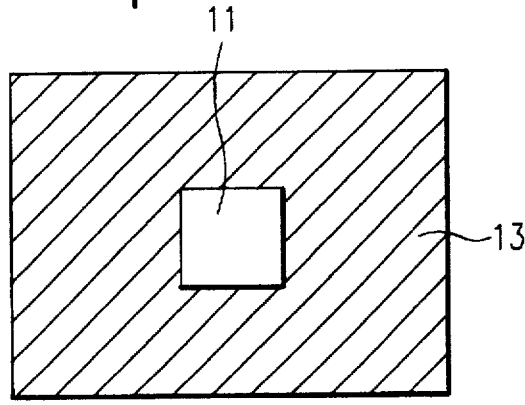
FIGS. 1a through 1d show a conventional phase-shifting mask and the amplitudes at a mask and wafer.
Figure 1B:
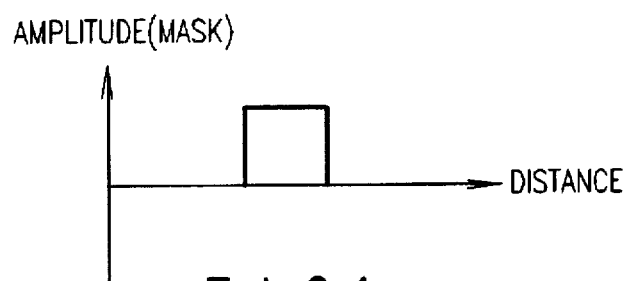
Figure 1C:
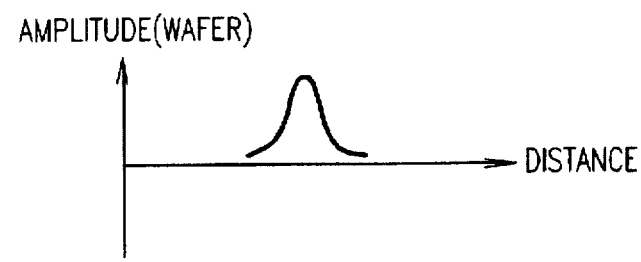
Figure 1D:
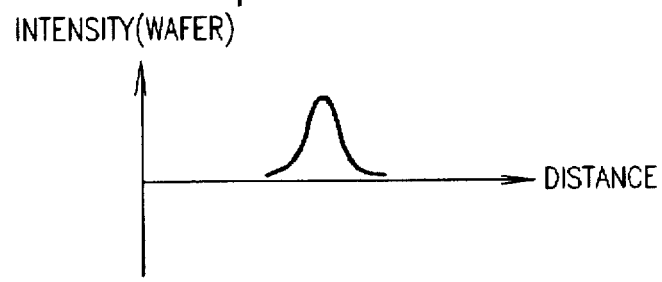
Figure 2A:
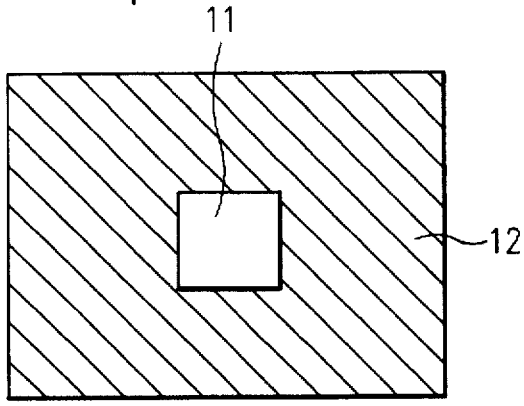
FIGS. 2a through 2d show a conventional phase-shifting mask having a single isolated pattern and the amplitudes at a mask and wafer.
Figure 2B:
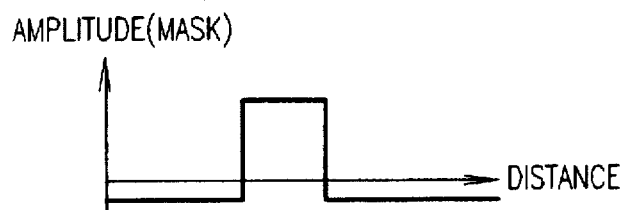
Figure 2C:
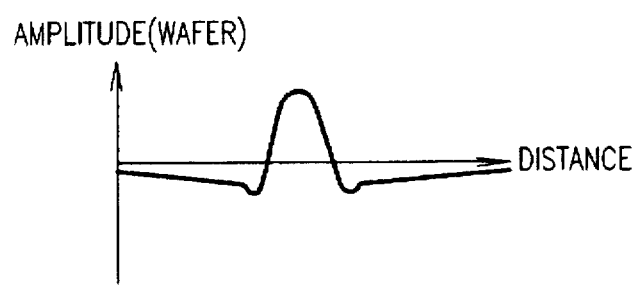
Figure 2D:
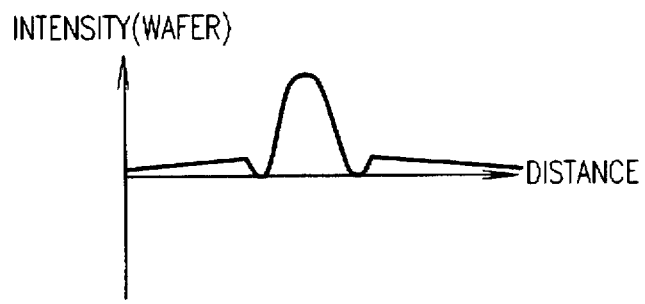
Figure 3:
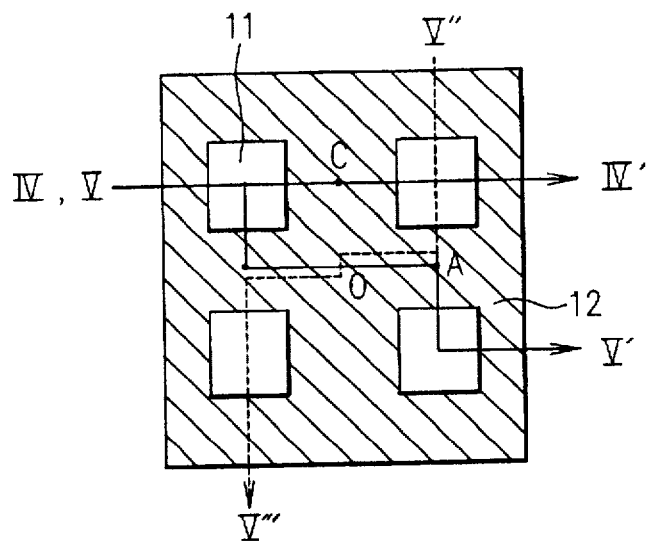
FIGS. 3 shows a plane view of a conventional phase-shifting mask having a plurality of isolated patterns.
Figure 4A:
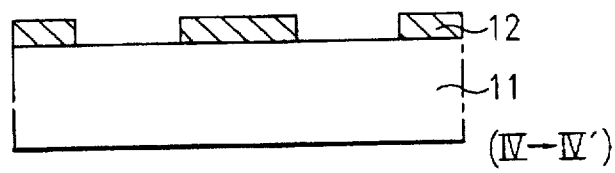
FIGS. 4a–4c show a sectional view of the phase-shifting mask across line IV–IV' in FIG. 3 and the amplitudes.
Figure 4B:
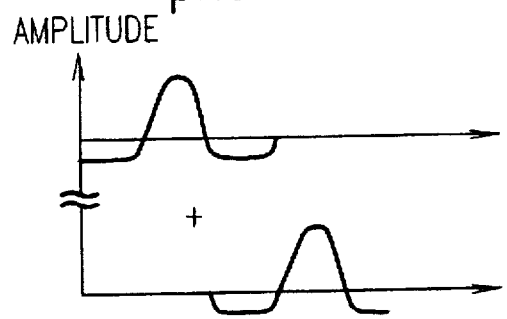
Figure 4C:
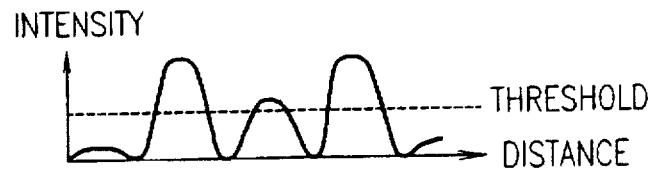
Figure 5A:
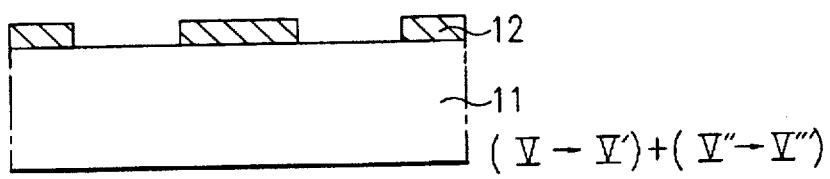
FIGS. 5a–5c show a sectional view of the phase-shifting mask across lines V–V' and V"–V'" in FIG. 3 and the amplitudes.
Figure 5B:
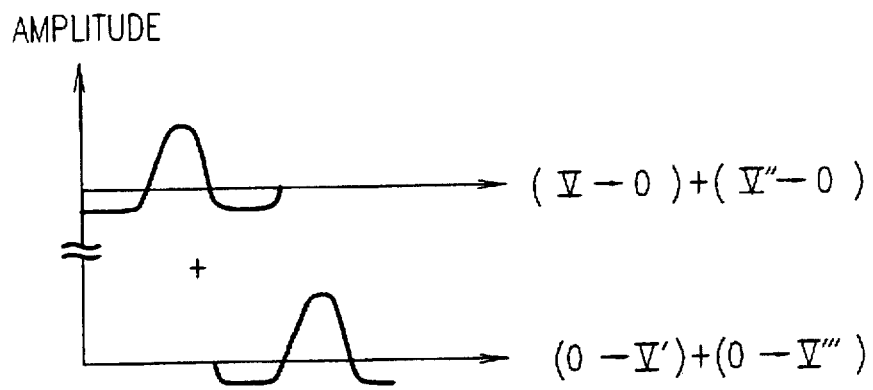
Figure 5C:
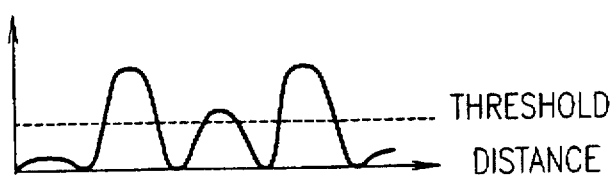
Figure 6:
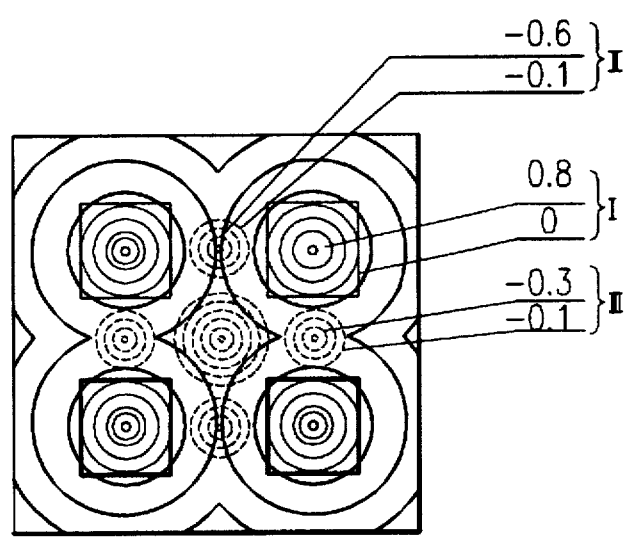
FIG. 6 shows a light energy distribution of the conventional phase-shifting mask having a plurality of isolated patterns in FIG. 3.
Figure 7:
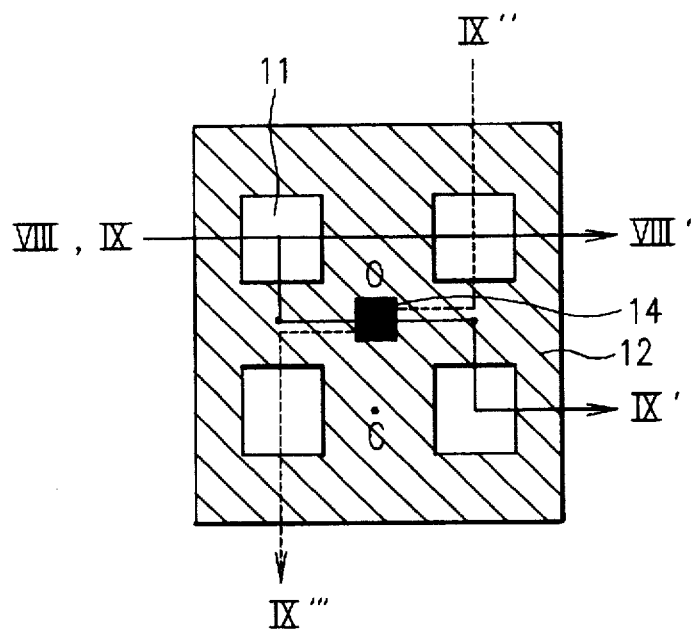
FIG. 7 shows a plane view of a phase-shifting mask in accordance with a first embodiment of the present invention.
Figure 8A:
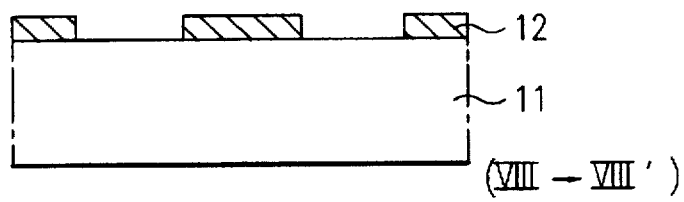
Figure 8B:
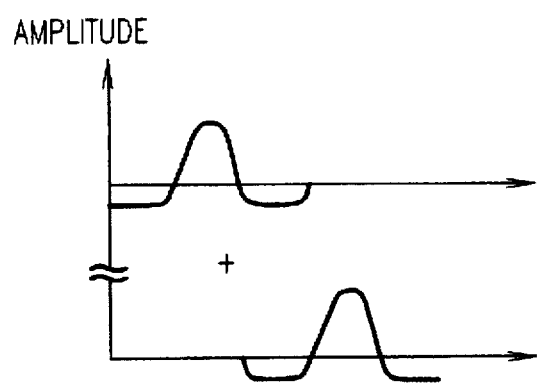

FIG. 7 shows a plane view of a phase-shifting mask in accordance with a first embodiment of the present invention, FIGS. 8a–8c show a sectional view of the phase-shifting mask across line VIII–VIII' in FIG. 7 and the amplitudes, FIGS. 9a–9c show a sectional view of the phase-shifting mask across lines IX–IX' and IX"–IX'" in FIG. 7 and the amplitudes, and FIG. 10 shows a light energy distribution of the phase-shifting mask in accordance with the first embodiment of the present invention.

As shown in FIG. 7, the first embodiment phase-shifting mask includes transparent regions formed spaced in an equal distance and adjacent to other transparent regions in the vertical and horizontal directions on a phase-shifting layer 12, and a supplementary light shielding layer 14 formed, not between two isolated patterns (transparent regions) (provided that the light intensity at a place between the two isolated patterns is not greater than the threshold value), centered between the four isolated patterns(transparent regions).

In this embodiment, the supplementary light shielding pattern 14 preferably is formed into a square shape.

A method for forming such a phase-shifting mask is as follows.

A phase-shifting layer 12, which has a transmissivity of 6–30% (or 6–15%, considering a thickness tolerance of the phase-shifting layer) and shifts a phase, is deposited on a transparent, such as glass substrate. Then, the phase-shifting layer 12 is selectively removed to form a half-tone mask having isolated patterns (transparent regions).

Of the transparent regions(isolated patterns) formed as above, one supplementary light shielding pattern 14 is formed so as to be centered between every four adjacent transparent regions(isolated patterns) 11. In this embodiment, the light shielding pattern 14 preferably is formed of metal, such as chrome.

If the distance between isolated patterns is formed to be in the range of $0.5(\lambda/NA) \sim 1.10(\lambda/NA)$, since one negative component overlapped light intensity(side lobe) is formed between each of the two adjacent isolated patterns in the phase shifting-mask of the present invention, the one supplementary light shielding pattern at the center of the four isolated patterns serves to offset the negative component overlapped light intensity. Here, $\lambda$ represents a wavelength of light from a light source, and NA represents a numerical aperture.

FIGS. 8b show magnitudes of the light intensity from each of the adjacent two isolated patterns shown in FIG. 8a, from which the problem of constructive interference is not arisen.

That is, the added amplitude of the overlapped light intensity from each of the two adjacent isolated patterns as shown in FIG. 8b does not exceed the threshold value of light intensity as shown in FIG. 8c.

In the meantime, FIG. 9a is a cross-sectional view across lines IX IX' and IX"IX'" in overlap, showing a supplementary light shielding pattern 14 formed between four isolated patterns.

That is, from the overlapped amplitude of the light intensity of the sections across lines IXO and IX"O(shown in upper side of FIG. 9b) and the overlapped amplitude of the light intensity of the sections across lines OIX' and OIX'" (shown in lower side of FIG. 9b), it can be known that the supplementary light shielding pattern 14 formed at the center of the four isolated patterns attenuates the overlapped negative component light intensity from the four isolated patterns as shown in FIG. 9c.

Herein, the dotted lines represent a state where there is no supplementary light shielding pattern is provided, and the solid lines represent a state when there is a supplementary light shielding pattern 14 is provided.

Accordingly, as shown in FIG. 9c, since the overlapped negative amplitude of the light intensity at the center of the four isolated patterns is attsupplement the supplementary light shielding pattern 14, so as not to exceed a threshold value, formation of unwanted light intensity peaks on a wafer can be prevented.

FIG. 10 shows an established light energy distribution at a wafer surface when aforementioned supplementary light shielding pattern 14 is formed.

That is, in case each of the transparent regions 11 has a positive amplitude light energy distribution of 0.8~0(I), the overlapped negative amplitude light energy due to the four transparent regions, attenuated by the supplementary light shielding region, forms negative amplitude light energy distributions of −0.2~−0.1(II) or −0.3~0(III) among the isolated patterns.

Figure 11:
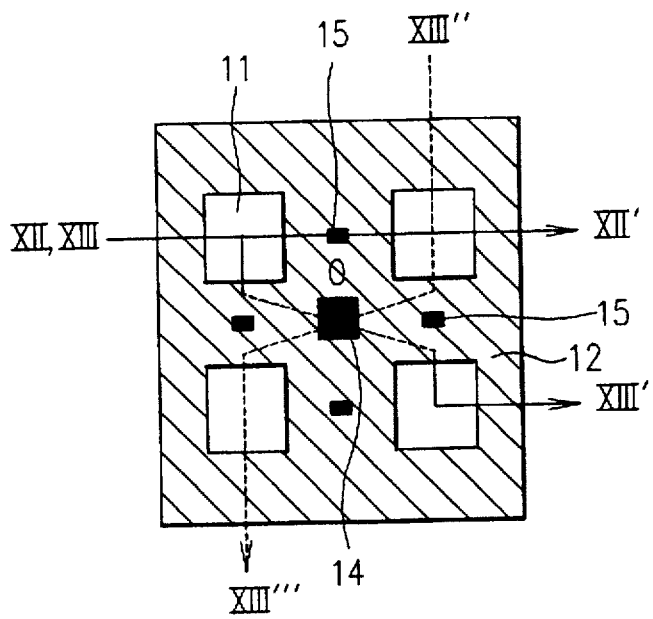
FIG. 11 shows a plane view of a phase-shifting mask in accordance with a second embodiment of the present invention.
Figure 12A:
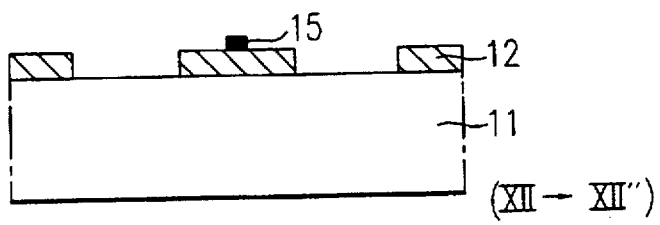
Figure 12B:
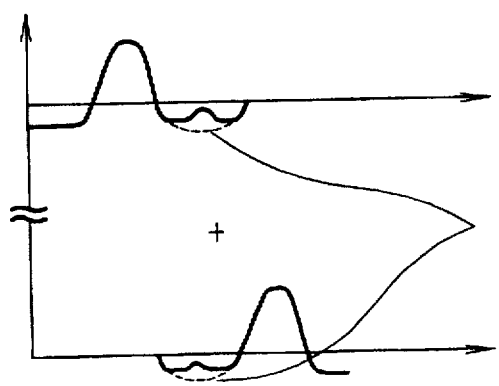

FIG. 11 shows a plane view of a phase-shifting mask in accordance with a second embodiment of the present invention. FIGS. 12a–12c show a sectional view of the phase-shifting mask across line XII~XII' in FIG. 11 and the amplitudes. FIGS. 13a–13c show a sectional view of the phase-shifting mask across lines XIII–XIII' and XIII"–XIII'" in FIG. 11 and the amplitudes, and FIG. 14 shows a light intensity distribution of the phase-shifting mask in accordance with the second embodiment of the present invention.

As shown in FIGS. 11 and 12a, the second embodiment phase-shifting mask of the present invention has a supplementary light shielding layer 15 formed so as to be centered between each pair, isolated patterns 11 of the first embodiment system. Accordingly, the supplementary light shielding patterns 15 offset the negative amplitudes, and so the resolution can be improved more.

Herein, the dotted lines represent amplitudes when the supplementary light shielding patterns are not formed, and the solid lines represent amplitudes when the supplementary light shielding patterns are formed, with corresponding reduction of the amplitudes.

A method for forming the phase-shifting mask in accordance with the second embodiment of the present invention is the same with the method of the first embodiment, except for the addition of the supplementary light shielding patterns, and FIGS. 13a–13c is the same with that of the first embodiment.

Shown in FIG. 14 is an established light energy distribution on a wafer surface when the first, and second supplementary light shielding patterns 14 and 15 are provided, showing lower negative amplitude light energy distributions.

Figure 18:
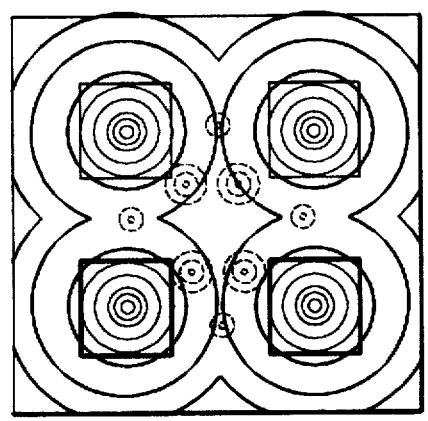
FIG. 18 shows a light energy distribution of the phase-shifting mask in accordance with the third embodiment of the present invention.

FIG. 15 shows a plane view of a phase-shifting mask in accordance with a third embodiment of the present invention. FIGS. 16a–16c show a sectional view of the phase-shifting mask across line XVI–XVI' in FIG. 15 and the amplitudes, FIGS. 17a–17c show a sectional view of the phase-shifting mask across lines XVII–XVII' and XVII"–XVII'" in FIG. 14 and the amplitudes, and FIG. 18 shows a light intensity distribution of the phase-shifting mask in accordance with the third embodiment of the present invention.

The phase-shifting mask in accordance with the third embodiment of the present invention has isolated patterns which are more closely spaced in the X direction than in the Y direction.

That is, as shown in FIG. 15, 16a and 17a, each of the supplementary light shielding pattern 16 is formed, not between two isolated patterns, but so as to be centered between four isolated patterns.

Each of the supplementary light shielding patterns 16 is formed into a rectangular shape with its length along the X-axis being longer than its length along the Y-axis. The reason of the supplementary light shielding pattern 16 being formed in this shape is that the primary and secondary side lobes (negative amplitude components) formed by two adjacent isolated patterns along the X-axis is stronger than the primary and secondary side lobes(negative amplitude components) formed by two adjacent isolated patterns along the Y-axis.

Accordingly, as shown in FIGS. 16b and 16c, though the negative amplitude light intensity at a part between the two isolated patterns, amplified due to no presence of attenuating supplementary light shielding patterns, is slightly higher, it remains lower than a threshold value so that an unnecessary pattern can not be formed.

Because the rectangular supplementary light shielding patterns offset overlapped light intensity so that the light energy is lowered below a threshold value, as shown in FIG. 17b and 17c, no unnecessary patterns can be formed.

Herein, the thick dotted lines represent negative amplitude light intensity when there is no supplementary light shielding pattern, the one dotted chain lines represent negative amplitude light intensity when there is a square supplementary light shielding pattern, and the solid lines represent negative amplitude light intensity when there is a rectangular supplementary light shielding pattern 16.

Therefore, it can be known that formation of the rectangular pattern is more effective in case X-axis, and Y-axis distances to adjacent isolated patterns are different.

Shown in the FIG. 18 is a distribution of light energy in case in which a rectangular supplementary light shielding pattern 16 is present, of which solid lines represent light intensity of positive amplitudes and dotted lines represent light intensity of negative amplitudes.

Figure 19:
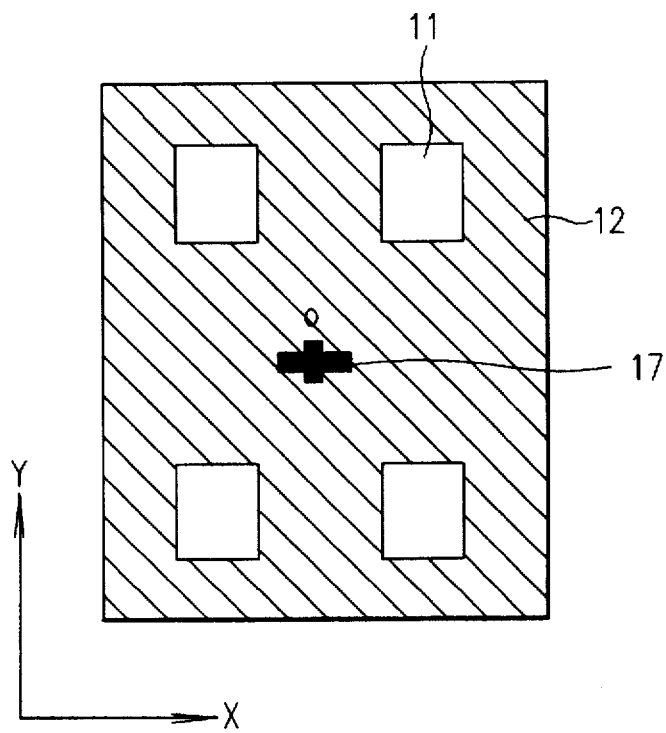
FIG. 19 shows a plane view of a phase-shifting mask in accordance with a fourth embodiment of the present invention.

FIG. 19 shows a plane view of a phase-shifting mask in accordance with a fourth embodiment of this invention.

The phase-shifting mask of the fourth embodiment also has isolated patterns, the spacing of which is along the X-axis and the Y-axis. In particular, the fourth embodiment is related to a method of forming a supplementary light shielding pattern when the X-axis spacing is shorter than the Y-axis spacing.

As has been explained in the third embodiment, the aforementioned supplementary light shielding pattern 17 can also lower the overlapped light energy below a threshold value which prevents the formation of unnecessary patterns.

Figure 20:
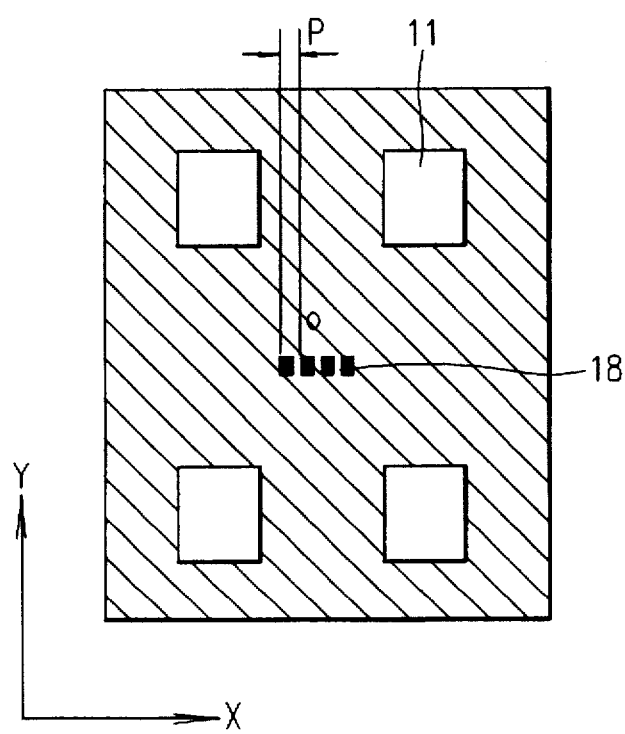
FIG. 20 shows a plane view of a phase-shifting mask in accordance with a fifth embodiment of the present invention.

FIG. 20 shows a plane view of a phase-shifting mask in accordance with a fifth embodiment of this invention.

As in the third, and fourth embodiments, the phase-shifting mask of the fifth embodiment also has isolated patterns, the spacing of which is different along the X-axis and Y-axis. In particular, the fifth embodiment is related to a method of forming a supplementary light shielding pattern when the X-axis spacing is shorter than the Y-axis spacing.

That is, as shown in FIG. 20, a plurality of square light shielding patterns 18 are arranged parallel to the X-axis in dot-form with a pitch between the dots arranged to be less than a resolving power limit(R) of the light source.

The resolution power limit(R) is expressed as follows:

R=K($\lambda$/NA), where K is an exposure index, $\lambda$ is a wavelength and NA is a numerical aperture.

FIG. 21 shows a plane view of a phase-shifting mask in accordance with a sixth embodiment of this invention, and FIG. 22 shows a plane view of a phase-shifting mask in accordance with a seventh embodiment of this invention.

As in the third, fourth, and fifth embodiments, the phase-shifting mask of the sixth embodiment also has isolated patterns, the spacing of which is different along the X-axis and the Y-axis. In particular, the sixth embodiment is related to a method of forming a supplementary transparent pattern when the X-axis spacing is shorter than the Y-axis spacing.

That is, instead of the supplementary light shielding pattern 16, the phase-shifting mask of the sixth embodiment, e.g., FIG. 21, has a supplementary pattern (transparent region) 19 positioned so as to be centered between the four isolated patterns, produced by selectively removing the phase-shifting layer 12 to a size and rectangular shape the same as the supplementary light shielding pattern 16 of the third embodiment.

Instead, instead of the dot-form supplementary light shielding pattern 18 of the fifth embodiment, the phase-shifting mask of the seventh embodiment, e.g., FIG. 22, has a supplementary patterns (of transparent regions) 20 positioned so as to be centered between the four isolated patterns, produced by selectively removing the phase-shifting layer 12 to a size and shape the same as the supplementary light shielding pattern 18 of the third embodiment.

As in the fifth embodiment, the pitch of the dots should be below the resolving power limit(R) of the light source.

The phase-shifting mask in accordance with this invention, as has been explained, has following advantages.

First, the supplementary light shielding pattern or the supplementary transparent pattern, formed between adjacent isolated patterns, can offset constructive interference of negative amplitudes, so that formation of unnecessary patterns can be prevented.

Second, even when the spacing between adjacent isolated patterns in X and Y directions are different, by arranging a supplementary light shielding pattern or a supplementary transparent pattern in correspondence to the arrangement of the isolated patterns, constructive interference of negative amplitude can be offset, so that formation of unnecessary patterns can be prevented.

Third, since formation of unwanted light intensity peaks can be prevented as described above, the exposure margin can be increased allowing an extensive exposure process.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the claims.

What is claimed is:

1. A method of manufacturing a phase-shifting and attenuating mask comprising the steps of:

providing a transparent substrate;

forming a phase-shifting and attenuating layer on said transparent substrate;

selectively removing said phase-shifting and attenuating layer to form a half-tone mask having a plurality of transparent regions; and, forming at least one light shielding pattern on said phase-shifting and attenuating layer between said transparent regions.

2. The method as claimed in claim 1, wherein said transparent substrate is formed of glass.

3. The method as claimed in claim 1, wherein said phase-shifting and attenuating layer has a light transmissivity of 6–30%.

4. The method as claimed in claim 3, wherein said phase-shifting and attenuating layer has a light transmissivity of 6–15%.

5. The method as claimed in claim 1, wherein said at least one light shielding pattern is formed of chrome.

6. The method as claimed in claim 1, wherein said at least one light shielding pattern is formed at a position equally spaced from the centers of at least two adjacent transparent regions.

7. The method as claimed in claim 6, wherein a shape of said at least one light shielding pattern is circular, rectangular, a cross or a grouping of plural dots.

8. The method as claimed in claim 6, wherein said at least one light shielding pattern is formed at a position equally spaced from the centers of four adjacent transparent regions.

9. The method as claimed in claim 1, wherein the center of said supplementary light shielding pattern is located halfway between said transparent regions, with a linewidth which divides a light intensity peak into two.

10. The method as claimed in claim 1, wherein distances between said transparent regions fall in the range of about 0.5(lambda/NA) to 1.1(lambda/NA), where lambda represents a wavelength of light and NA represents a numerical aperture.

11. The method as claimed in claim 1, wherein said transparent regions are substantially larger than said at least one light shielding pattern.

12. A method of manufacturing a phase-shifting and attenuating mask comprising the steps of:
providing a transparent substrate;
forming a phase-shifting and attenuating layer on said transparent substrate; and,
selectively removing said phase-shifting and attenuating layer for a simultaneous formation of at least two primary transparent regions and at least one supplementary transparent region located in a main area defined by said primary transparent regions, said at least one supplementary transparent region preventing unwanted constructive interference in areas between the transparent regions, said primary transparent regions being substantially larger than said supplementary transparent regions.

13. The method as claimed in claim 12, wherein said transparent substrate is formed of glass.

14. The method as claimed in claim 12, wherein said phase-shifting and attenuating layer has a light transmissivity of 6–30%.

15. The method as claimed in claim 12, wherein a shape of said at least one supplementary transparent region is elliptic, rectangular, a cross or a grouping of plural dots.

16. The method as claimed in claim 12, wherein said at least one supplementary transparent region is formed at a position substantially equally spaced between the centers of at least two primary transparent regions.

17. The method as claimed in claim 16, wherein said at least one supplementary transparent region is formed at a position substantially equally spaced between the centers of four primary transparent regions.

18. A phase-shifting and attenuating mask, including:
a transparent substrate;
a phase-shifting and attenuating layer having a plurality of primary transparent regions formed on the transparent substrate; and
a plurality of supplementary light shielding patterns formed on the phase-shifting and attenuating layer between the transparent regions.

19. The mask as claimed in claim 18, wherein the at least one supplementary light shielding pattern is formed at a position equally distanced to at least two adjacent said primary transparent regions.

20. The mask as claimed in claim 19, wherein said light shielding patterns are formed at a position equally spaced from the centers of four adjacent primary transparent regions.

21. The mask as claimed in claim 18, wherein a shape of a supplementary light shielding pattern is circular, rectangular, a cross or a grouping of dots.

22. The mask as claimed in claim 18, wherein the supplementary light shielding pattern is formed so that a length along the X-axis is greater than a length along the Y-axis where an X-axis distance is smaller than a Y-axis distance with respect to adjacent transparent regions.

23. The mask as claimed in claim 22, wherein a shape of the supplementary light shielding pattern is rectangular.

24. The mask as claimed in claim 22, wherein a shape of the supplementary light shielding pattern is a rectangular cross.

25. The mask as claimed in claim 18, wherein distances between said primary transparent regions fall in the range of about 0.5(lambda/NA) to 1.1(lambda/NA), where lambda represents a wavelength of light and NA represents a numerical aperture.

26. A phase-shifting and attenuating mask, including:
a transparent substrate; and
a phase-shifting and attenuating layer, formed on the transparent substrate, having a plurality of primary transparent regions and at least one supplementary transparent region located in a main area defined by said primary transparent regions, said supplementary transparent region being for prevention of unwanted constructive interference in areas between the plurality of primary transparent regions, respectively, said primary transparent regions being substantially larger than said supplementary transparent regions.

27. The mask as claimed in claim 26, wherein a shape of the at least one supplementary transparent region is elliptic, rectangular, a cross or a grouping of dots.

28. The mask as claimed in claim 26, wherein the at least one supplementary transparent region is formed so that a length alone the X-axis is greater than a length along the Y-axis where an X-axis distance is smaller than a Y-axis distance with respect to adjacent transparent regions.

29. The mask as claimed in claim 28, wherein a shape of the at least one supplementary transparent region is rectangular.

30. The mask as claimed in claim 28, wherein a shape of the at least one supplementary transparent region is a group of dots.

31. The mask as claimed in claim 26, wherein said at least on supplementary transparent region is formed at a position substantially equally spaced between the centers of at least two primary transparent regions.

32. The mask as claimed in claim 31, wherein said at least one supplementary transparent region is formed at a position substantially equally spaced between the centers of four primary transparent regions.

* * * * *